(12) United States Patent
Oudshoorn et al.

(10) Patent No.: US 8,477,287 B2
(45) Date of Patent: *Jul. 2, 2013

(54) DEVICE MANUFACTURING METHOD, LITHOGRAPHIC APPARATUS AND A COMPUTER PROGRAM

(75) Inventors: Alex Oudshoorn, Woerden (NL); Leon Martin Levasier, Hedel (NL); Erik Roelof Loopstra, Eindhoven (NL); Roland Blok, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 432 days.

This patent is subject to a terminal disclaimer.

(21) Appl. No.: 12/531,230

(22) PCT Filed: Mar. 14, 2008

(86) PCT No.: PCT/NL2008/050146
§ 371 (c)(1),
(2), (4) Date: Apr. 2, 2010

(87) PCT Pub. No.: WO2008/111839
PCT Pub. Date: Sep. 18, 2008

(65) Prior Publication Data
US 2010/0231890 A1    Sep. 16, 2010

Related U.S. Application Data

(63) Continuation-in-part of application No. 11/717,786, filed on Mar. 14, 2007, now Pat. No. 7,894,038.

(51) Int. Cl.
*G03B 27/42* (2006.01)
*G03B 27/52* (2006.01)
*G03B 27/58* (2006.01)

(52) U.S. Cl.
USPC .................................. 355/53; 355/55; 355/72

(58) Field of Classification Search
USPC .............................. 355/30, 52, 53, 55, 72–77
See application file for complete search history.

(56) References Cited

U.S. PATENT DOCUMENTS 6,002,487 A  12/1999  Shirata
6,260,282 B1  7/2001  Yuan et al.
(Continued)

FOREIGN PATENT DOCUMENTS

EP   1 037 117 A2   9/2000
EP   1 231 513 A1   8/2002
(Continued)

OTHER PUBLICATIONS

Non-Final Rejection mailed Aug. 3, 2009 for U.S. Appl. No. 11/717,786, 11 pgs.
(Continued)

*Primary Examiner* — Hung Henry Nguyen
(74) *Attorney, Agent, or Firm* — Sterne, Kessler, Goldstein & Fox P.L.L.C.

(57) ABSTRACT

The invention relates to a device manufacturing method comprising exposing a substrate with a patterned beam of radiation formed by a reticle mounted on a displaceable reticle stage, wherein the method comprises the steps of determining a non-linear function for approximating a height and a tilt profile of a reticle surface with respect to the reticle stage and controlling a displacement of the reticle stage during exposure of the substrate in accordance with the non-linear function. The invention further relates to a lithographic apparatus and a computer program.

15 Claims, 7 Drawing Sheets

U.S. PATENT DOCUMENTS

| | | | |
|---|---|---|---|
| 6,835,511 B2 * | 12/2004 | Hirayanagi | 430/22 |
| 6,879,374 B2 | 4/2005 | Van Der Werf et al. | |
| 6,934,005 B2 | 8/2005 | Roux et al. | |
| 7,046,334 B2 * | 5/2006 | Kono et al. | 355/53 |
| 7,078,135 B2 | 7/2006 | Kamm et al. | |
| 7,113,256 B2 | 9/2006 | Butler et al. | |
| 7,733,462 B2 * | 6/2010 | Nawata | 355/53 |
| 7,894,038 B2 * | 2/2011 | Oudshoorn et al. | 355/53 |
| 2001/0002303 A1 | 5/2001 | Yuan | |
| 2003/0090640 A1 | 5/2003 | Fujisawa et al. | |
| 2004/0013956 A1 | 1/2004 | Sogard | |
| 2004/0048400 A1 | 3/2004 | Roux et al. | |
| 2004/0080737 A1 | 4/2004 | Jasper et al. | |
| 2004/0179180 A1 | 9/2004 | Miura | |
| 2006/0187456 A1 | 8/2006 | Hirayanagi et al. | |
| 2008/0225252 A1 | 9/2008 | Oudshoorn et al. | |

FOREIGN PATENT DOCUMENTS

| | | |
|---|---|---|
| EP | 1 566 696 A1 | 8/2005 |
| EP | 1 139 176 B1 | 5/2006 |
| JP | 2005-236296 A | 9/2005 |
| WO | WO 2006/068288 A1 | 6/2006 |

OTHER PUBLICATIONS

Search Report for International Application No. PCT/NL2008/050146 mailed Jul. 17, 2008, 2 pgs.

Final Office Action mailed Aug. 2, 2010, directed to related U.S. Appl. No. 11/717,786, filed Mar. 14, 2007; 9 pages.

Non-Final Rejection mailed Mar. 17, 2010 for U.S. Appl. No. 11/717,786, 11 pgs.

International Preliminary Report on Patentability and Written Opinion of the International Searching Authofty directed to related International Patent Application No. PCT/NL2008/050146, mailed Sep. 15, 2009, from the International Bureau of WIPO; 9 pages.

Notice of Allowance mailed Nov. 1, 2010 for U.S. Appl. No. 11/717,786, filed Mar. 14, 2007; 7 pages.

* cited by examiner

DEVICE MANUFACTURING METHOD, LITHOGRAPHIC APPARATUS AND A COMPUTER PROGRAM

CROSS-REFERENCE TO RELATED APPLICATIONS

The present application is a 35 U.S.C. §371 U.S. national phase filing of International Application No. PCT/NL2008/050146, filed on Mar. 14, 2008, which was published in the English language on Sep. 18, 2008, as WO 2008/111839, and which claims priority as a continuation-in-part to U.S. patent application Ser. No. 11/717,786, filed Mar. 14, 2007; each of the above applications is incorporated herein by reference in its entirety.

This is a U.S. national phase application of PCT/NL08/50146 filed Mar. 14, 2008, which claims priority to U.S. patent application Ser. No. 11/717,786 filed on Mar. 14, 2007, now U.S. Pat. No. 7,894,038.

FIELD

The present invention relates to a method for manufacturing a device, a lithographic apparatus and a computer program.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Historically, in lithographic tools a mounting side and a patterned side of a reticle are one and the same, establishing a reticle focal plane at a plane of a reticle stage plate. Thus, knowledge of stage position in six degrees of freedom (DOF) results in knowledge of the reticle patterned surface position in six DOF. The six DOF are X, Y, Z, Rx, Ry, and Rz, as shown in FIG. 2. However, mounting (or clamping) of an extreme ultra violet (EUV) reticle will almost certainly be to a back surface of the reticle (e.g., opposite from the patterned surface). Backside clamping results in a reticle focal plane position relative to the reticle stage that is a function of reticle height and tilt profile. Thus, in contrast to deep ultra violet (DUV) systems, knowledge of the reticle stage position does not resolve where the pattern of the reticle is located in all six DOF. The out-of-plane DOF (Z, Rx, and Ry) cannot be easily determined due to the thickness variation of the reticle. The position of the patterned side (opposite to the clamped side) of the reticle needs to be known accurately in all six DOF. Hereinafter, the aforementioned patterned surface of the reticle is referred to in the text and claims as the reticle surface or patterned reticle surface.

In almost all steppers and scanners three in-plane DOF (X, Y, and Rz) are determined from typical stage metrology schemes using interferometers. However, three out-of-plane DOF (Z, Ry, and Rx) are more difficult to measure. As discussed above, in an EUV tool, Z, Rx, and Ry have to be known with much higher accuracy than in previous lithography tools. The accuracy requirement stems from the need to position the pattern on the reticle at a focal plane related to optics of the lithography tool. Also, in some cases, optics are not telecentric at the reticle focal plane, which increases the need for accurately determining the reticle position on the reticle stage to within six DOF. The focal place is also referred as the best object plane. At the same time, it is critical to accurately maintain focus on the pattern on the reticle even though the reticle has a certain height and tilt profile with respect to the reticle stage. Therefore, measuring the Z position and the out of plane tilts (Rx and Ry) of the patterned side of the reticle in the EUV tool requires tight accuracy.

An embodiment of a measuring system is known from U.S. Pat. No. 6,934,005. The known system comprises an interferometer arranged to provide input data related to a height and tilt profile of the reticle surface. These data are subsequently processed by a suitable computer program to linearly approximate the height and the tilt profile of the reticle surface. For this purpose the reticle comprises two reflective paths arranged substantially at opposite sides of the reticle, notably extending along the y-direction of a coordinate system assigned to the reticle and the reticle stage, see FIG. 2. The interferometer data is used to approximate the reticle surface, which is used for controlling a linear displacement of the reticle stage during a suitable exposure of the substrate.

It is disadvantage of the known method that considerable distortions occur when the reticle stage moves linearly during the exposure of the substrate.

SUMMARY

It is desirable to provide a device manufacturing method, particularly for Extreme Ultra Violet (EUV) range, wherein distortion maps occurring at the best object plane are substantially reduced.

According to an aspect of the invention a device manufacturing method comprises exposing a substrate with a patterned beam of radiation formed by a reticle mounted on a displaceable reticle stage, wherein the method comprises the steps of:

determining a non-linear function for approximating a height and a tilt profile of a reticle surface with respect to the reticle stage;

controlling a displacement of the reticle stage during exposure of the substrate in accordance with the non-linear function.

According to an aspect of the invention a lithographic apparatus arranged to project a pattern from a patterning device onto a substrate comprises a displaceable reticle stage arranged for supporting a reticle, said reticle having a patterned side;

a detector for determining data related to a height and a tilt profile of a reticle surface with respect to the reticle stage;

computing means for approximating a reticle surface by a non-linear function using the said data;

a controller for controlling a displacement of the reticle stage during exposure of the substrate in accordance with the non-linear function.

According to an aspect of the invention a lithographic apparatus comprises an illumination system configured to condition a radiation beam;

a support constructed to support a patterning device, the patterning device being capable of imparting the radiation beam with a pattern in its cross-section to form a patterned radiation beam, whereby the support is displaceably arranged;

a substrate table constructed to hold a substrate; and a projection system configured to project the patterned radiation beam onto a target portion of the substrate, a detector for determining data related to a height and a tilt profile of a reticle surface with respect to the reticle stage;

wherein the lithographic apparatus further comprises a computing means for approximating the height and the tilt profile by a non-linear function using the said data;

a controller for controlling a displacement of the reticle stage during exposure of the substrate in accordance with the non-linear function.

According to an aspect of the invention a computer program comprises instructions for causing a processor to execute the steps of the method as set forth in the foregoing.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
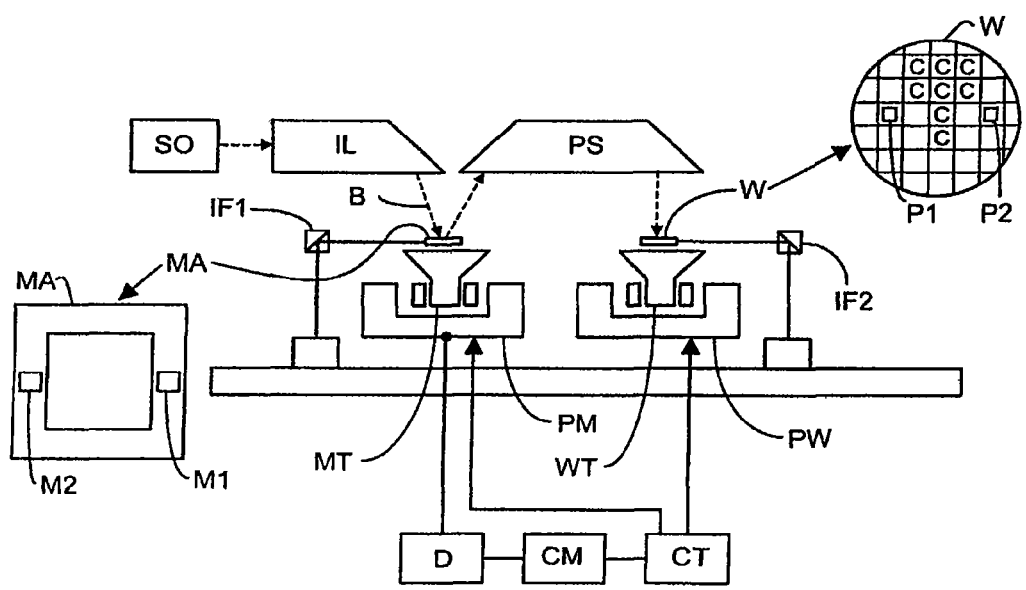
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B, notably an EUV radiation.

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus according to the invention further comprises a detector D for determining measurement data related to a height and a tilt profile of the reticle surface with respect to the reticle stage; computing means CM for approximating the height and the tilt profile by a non-linear function and a controller C for controlling a displacement of the reticle stage during exposure of the substrate in accordance with the non-linear function. The controller C is arranged to displace the reticle stage during the exposure of a wafer in accordance with the non-linear function calculated by the computing means CM for approximating the height and the tilt profile of the reticle surface based in the measured data.

The technical measure of the invention is based on the insight that a substantial reduction of the distortion field in the best object plane is obtained by taking into account more than two degrees of freedom associated with a setpoint on the reticle surface and by controlling a displacement of the reticle stage in accordance therewith.

In practice a reticle has a non-linear height and tilt profile with respect to the reticle stage surface. The reticle surface can be mapped, for example, using a per se known technique in accordance with U.S. Pat. No. 6,934,005. A suitable interferometer system may be used, which includes, for example, two interferometers. Each interferometer in arranged to project an illuminating light from suitable illumination devices towards the reticle. The illumination device may comprise light sources, lasers, or the like with or without focusing or expanding optical devices. In accordance with the known technique, a first set of interferometric measuring beams from first interferometer are reflected from reflecting portions of the reticle thereby representing a height and a tilt profile of the reticle surface. The reflected beams are received by suitable detectors of the interferometer. Signals corresponding to the detected beams may be advantageously stored in a storage device either before or after being processed. A second set of interferometric measuring beams from the second interferometer are reflected from suitable positions on the reticle stage and detected by suitable detectors. Signals correlating to the detected beams may then be stored in storage unit.

The data thus obtained pertain to the reticle height and tilt profiles and are subsequently used in the method according to the invention for approximating the reticle surface with a non-linear function. Upon an event the information on the height and tilt profiles of the reticle is established, for example, by using suitably arranged computing means. An EUV reticle leveling functionality, arranged, notably, as a suitable computer program, is advantageously arranged to determine a reticle x-tilt Rx, a reticle z-height map z(y) or YTZ(y), and a reticle y-roll Ryy. The reticle y-roll is defined as a difference of y-tilt between the y-endpoints of the reticle. Further, a reticle y-tilt map Ry(y) is established. It is noted that other degrees of freedom of the reticle like the absolute tilt Ry and the absolute height z are determined by a suitable reticle alignment.

Upon an event the non-linear function approximating the reticle surface is established, the exposure of the substrate may be commenced, during which the reticle stage is displaced in accordance with the non-linear function thereby compensating for the non-linear height and tilt profile of the reticle surface. It has been found that due to the technical measure of the invention the distortion map of the image is substantially reduced.

In an embodiment of the invention for determining the non-linear function following steps are undertaken:
 a first dataset corresponding to a height and a tilt data of the reticle is determined on a first grid;
 a second dataset corresponding to a number of reticle stage setpoints is determined on a second grid;
 a sequence of the setpoints is fitted by the non-linear function.

Figure 3:
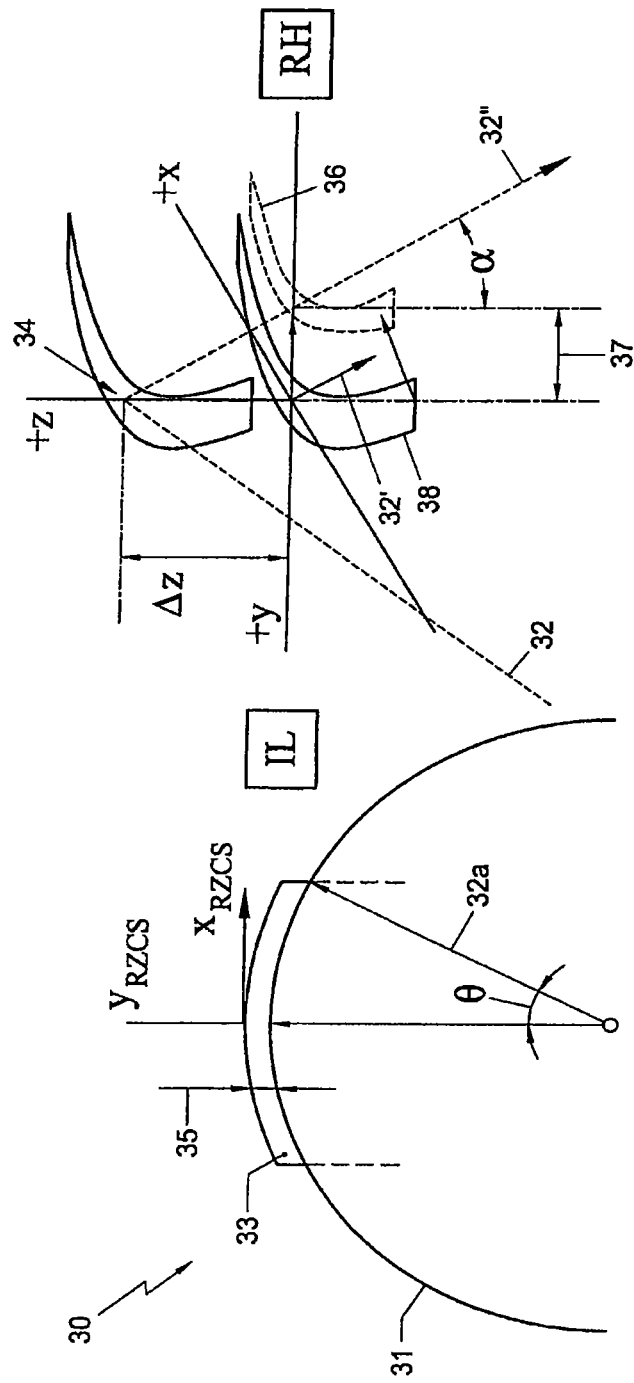
FIG. 3 depicts in a schematic way the exposure slit and an effect of a height offset (z-offset)

A number of EUV specific design features are responsible for distortion effects due to a certain reticle height a tilt profile, namely the fact that the reticle is reflective, secondly due to non-telecentricity of the optical axis and a diverging shape of the EUV light bundle. Finally, a portion of the light beam conceived to be projected to the reflective reticle is curved. This portion of the light beam is also referred to as an exposure slit. FIG. 3 shows in a schematic way the exposure slit and an effect of a height offset (z-offset) of the object leading to magnification and y-translation.

In order to compensate the influence of the z-offset on the quality of the image in the best object plane, for determining the non-linear function a first dataset corresponding to a height and a tilt data of the reticle is determined on a first grid; a second dataset corresponding to a number of reticle stage setpoints is determined on a second grid and a sequence of setpoints is fitted by the non-linear function. Detailed description of this embodiment is given with respect to FIG. 4.

In a further embodiment of the invention the least squares fit is used for the step of determining the second dataset thereby fitting the first grid and the second grid.

Figure 5:
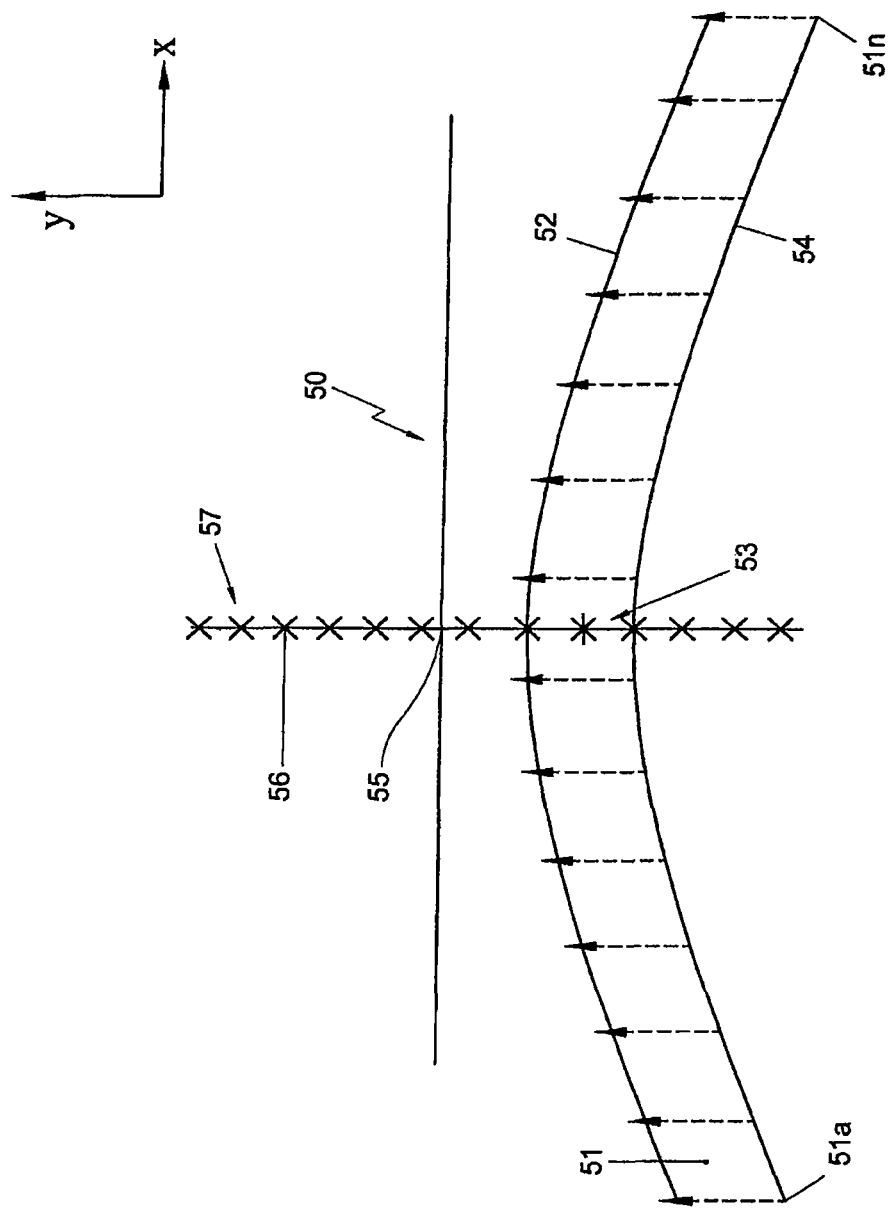
FIG. 5 depicts in a schematic way an embodiment of a computational grid defined on the slit.

In order to project the best object plane to the surface of the reticle at the positions of the setpoints, first, a curved grid over the slit is defined with fixed x-coordinates and y-pitches, see FIG. 5. The grid starts at the bottom and runs upwards until it reaches the top. Preferably, the least squares fit comprises a system of linear equations, whereby the object area on the reticle has substantially the same slit shape and substantially the same slit grid.

Advantages of an application of least squares fit relate first, to an automatic filtering of isolated pronounced peaks in the established height profile of the reticle surface and, secondly, to taking into account curvature of the slit.

Preferably, for the non-linear function a suitable polynomial profile is selected. The polynomial profile is generated by using the established data for the variables $z_{fit}$, $R_{y,fit}$ and $R_{x,fit}$. More preferably, the polynomial profile comprises a plurality of $4^{th}$ order polynomials, smoothly connected to each other. Such a function can be referred to as quartic spline. Mathematic functions, like splines are known per se in the art and their properties will not be explained here in detail. The controlling of the displacement of the reticle stage during exposure of the substrate is preferably carried out in accordance with the quartic ($4^{th}$ order) spline.

Preferably, the lithographic apparatus according to the invention comprises an interferometer arranged to determine measurement data for establishing the non-linear function approximating a surface of the reticle.

Figure 2:
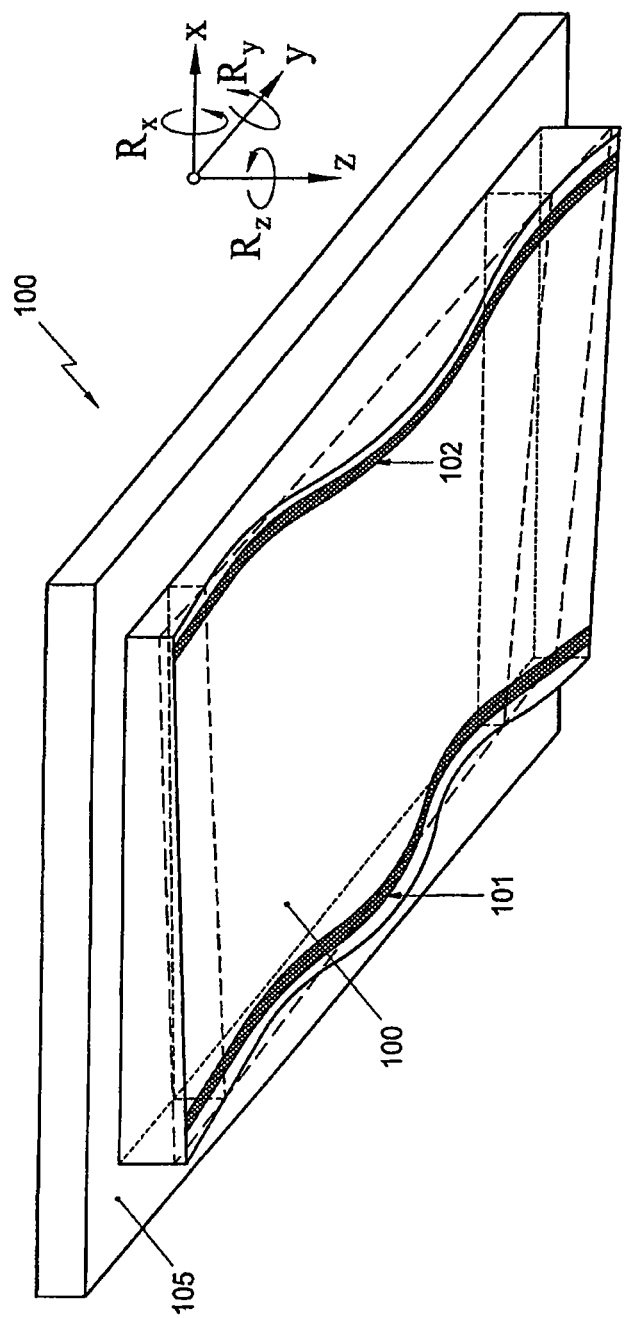
FIG. 2 depicts in a schematic way a coordinate system assigned with the reticle.

FIG. 2 presents in a schematic way a coordinate system assigned with the reticle. FIG. 2 shows six degrees of freedom (DOF) for a reticle 100 mounted on a reticle stage 105 and oriented in or parallel to an X-Y plane according to embodiments of the present invention. Again, the six DOF are X (along the X axis), Y (along the Y axis), Z (along the Z axis), Rx (rotation around the X axis), Ry (rotation around the Y axis), and Rz (rotation around the Z axis). The more easily determinable DOF are the X, Y, and Rz based on a reticle stages movements. In the embodiments discussed below, the DOF that are the focus of the discussion below are Z, Ry and Rx. It is to be appreciated that any DOF can be determined by the apparatus and methods below if the orientation of the reticle 100 is changed. The paths 101 and 102 are arranged as reflective portions of the reticle surface thereby enabling suitable measurements by means of an interferometer.

FIG. 3 depicts in a schematic way the exposure slit and an effect of a height offset (z-offset) of the reticle on the slit shape at the best object plane. FIG. 3 shows schematically a portion of an arc 31 on which the slit shape 33 is defined. A light beam (not shown) is usually arc-shaped having a radius 32a. The slit 33 is characterized by a half-angle θ and a thickness 35. It is noted that the object side of a projection system is non-telecentric since the illumination field on a reticle (not shown) is shifted off-axis from the projection system (not shown) and the projection beam enters the projection system at an angle with respect to the optical axis of the projection system.

Due to the non-telecentricity of the optical system of the lithographic apparatus, although deviation from telecentricity is preferably arranged to be as small as possible, local vertical z-deformations of the reticle result in horizontal (X or Y) distortions of the image at the best object plane, which is schematically illustrated in the right portion of FIG. 3. The light beam 32 is expected to bounce off at a substantially flat reflective reticle 35 and to propagate in a direction 32'. Due to the height variation Δz of the real reticle 34 with respect to the flat reticle 35, the light beam propagates in a direction 32" thereby causing a reduction of the slit shape 36 at the best object plane when the reticle has a z-displacement. It is noted that the slit shape is reduced for positive displacements (+z), otherwise the slit shape is enlarged. It is also noted that due to z-offset of the reticle, the slit shape is also displaced by a distance 37 in the y-direction.

Figure 4:
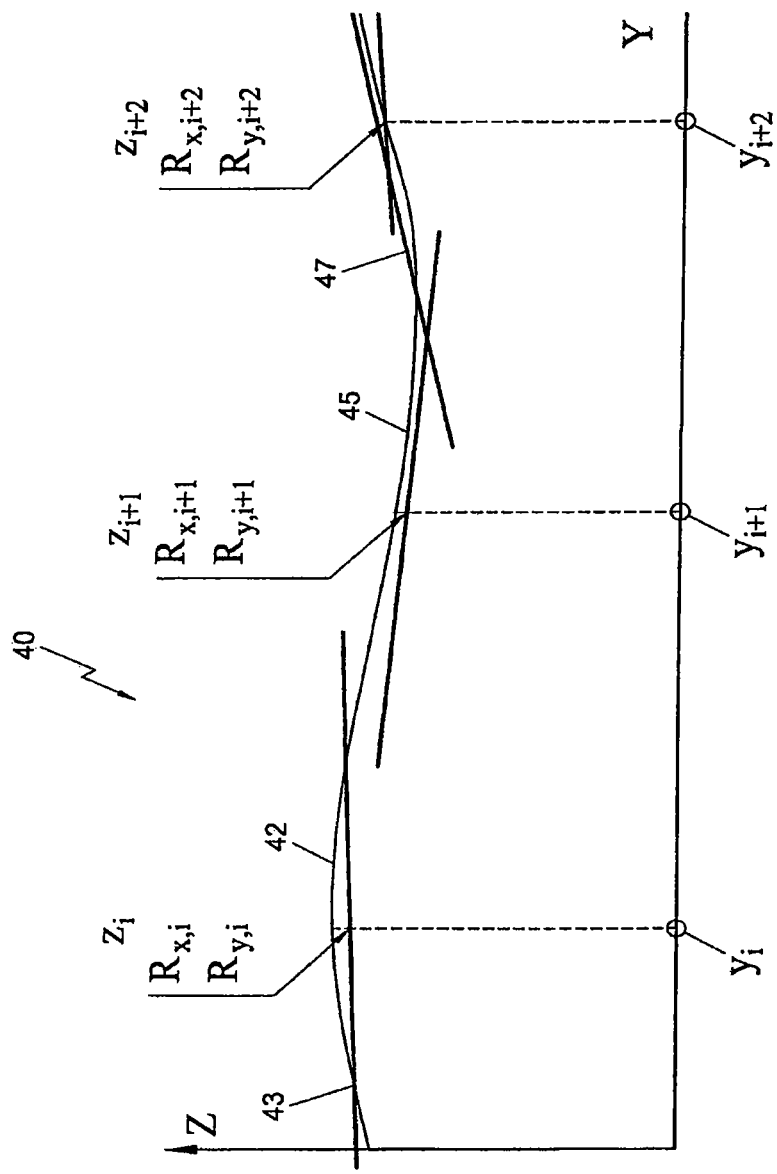
FIG. 4 depicts in a schematic way the best object plane aligned to the reticle surface.

FIG. 4 depicts in a schematic way the best object plane 43, 45, 47 aligned to the reticle surface 42. In order to enable the reticle stage to perform corrections for the height and tilt profile of the reticle, a reticle height map and tilt map are determined using reticle surface measurement points. This may be done in accordance with a per se known method using interferometers, which is described in U.S. Pat. No. 6,934,005. The thus established height and tilt profiles of the reticle constitute input data for a reticle levelling unit, which is arranged to compute reticle stage x-tilt values Rx, reticle stage z position and reticle stage y-tilt Ry. It must be understood that reticle stage setpoints represent a spatial position and tilt of the reticle stage. The reticle stagepoints are usually defined as a position of an origin of the reticle zero coordinate system (RZCS) in the reticle stage coordinate system (RSCS). In FIG. 4 the reticle stage setpoints are defined as a position of the origin of the best object plane coordinate system with respect to the origin of the reticle stage coordinate system. Alternatively, reticle measurement points may be assigned to notional lines associated with scribe lanes. Preferably, the scribe lanes comprise image sensor marks. For an EUV lithographic apparatus a reflective mask may be used, for example as described in U.S. Pat. No. 6,879,374. For a conventional lithographic apparatus either a reflective, or a transmissive image sensor mark (TISm) may be used, as described in U.S. Pat. No. 6,879,374. An embodiment of an image sensor mark arranged on the scribe lanes will be discussed in further detail with reference to FIG. 7.

In order to compute a function resolving the alignment between the best object plane and the reticle surface, a number of setpoints $y_i, y_{i+1}, y_{i+2}$, etc. defined on the reticle stage surface are fitted to the reticle 42. Each setpoint is characterized by a number of calculated variables, namely height $z_i$, a first tilt $R_{x,i}$, and a second tilt $R_{y,i}$. Preferably, these parameters are calculated using a least squares fit of the reticle surface to the best object plane, it being explained in more detail with reference to FIG. 5.

FIG. 5 depicts in a schematic way an embodiment of a computational grid defined on the slit. The slit 51 is approximated by a curved grid constituting points $51a \ldots 51n$, which may be chosen with a constant x and y pitches. It is noted that the top surface 52 and bottom surface 54 of the grid constitute respective sections of a circle and therefore don't run parallel with constant offset in the y-direction. The grid is conveniently formed by seeding the grid points at one surface, for example, the surface 52, and by expanding it until the second surface 54 is reached. The origin of the slit grid is schematically denoted by 53. In accordance with the technical measure of the invention the first dataset corresponding to a height and a tilt data of the reticle is defined on the first grid 57. The second dataset, corresponding to a number of reticle stage setpoints 56 is determined on a second grid 56. The first grid 57 and the second grid 56 have a mutual origin 55. Both grids 56 and 67 are defined on the y-axis of the reticle coordinate system RCS.

Alignment of the slit shaped area in the best object plane (BOP) to the slit shaped area on the reticle, is performed as follows. Let RZCS be "framework" coordinates with respect to which the reticle stage moves and is positioned. Let $x_{rzcs}$ be coordinates in the RZCS and let $x_{rscs}$ be coordinates in the reticle stage coordinate system (RSCS). The 3D transformation equation of the reticle stage coordinate system (RSCS) to the reticle zero coordinate system (RZCS) is written as $$\underline{x}_{rzcs} = \underline{T}_e \cdot \underline{T} \cdot (\underline{x}_{rscs} - \underline{M}_t \cdot \underline{t} + \underline{e}_{rs}).$$

Here the diagonal matrix $M_t$ is the reticle stage interferometer scaling. Here $e_{rs}$ is the reticle stage zeroing offset and $T_e$ is the reticle stage zeroing rotation offset matrix. Here the infinitesimal rotation matrix $$\underline{T} = \begin{bmatrix} 1 & -T_z & T_y \\ T_z & 1 & -T_x \\ -T_y & T_x & 1 \end{bmatrix}$$

and vector $t=(t_x,t_y,t_z)$ are transformation parameters. The (vertical) out-of-plane components $T_y$, $T_x$ and $t_z$ of respectively $T$ and $t$ are the out-of-plane reticle stage setpoints. Let $x_o$ be a coordinate in the best object plane coordinate system (OPCS). The 3D transformation equation of OPCS to the RZCS is $$\underline{x}_{rzcs} = \underline{R}_o \cdot \underline{x}_o + \underline{C}_o,$$

where the matrix $R_o$ and the vector $C_o$ are the transformation parameters.

In the following, square brackets behind a symbol, indicate that it is a function of the value between the brackets.
Let $x_{rcs}$ be coordinates in the reticle coordinate system (RCS) and $y_{rcs}$ the corresponding y-coordinate. The 3D transformation equation of the RCS the RSCS is $$\underline{x}_{rscs} = \underline{M} \cdot \underline{R}[y_{rcs}] \cdot \underline{x}_{rcs} + \underline{C}_r + YTZ[y_{rcs}] \cdot \underline{e}_z.$$

Here M is a diagonal magnification matrix. Here $C_r$ is a translation parameter, $e_z$ is the unit vector in the z-direction and $YTZ[y_{rcs}]$ is the reticle height map function. Here $$\underline{R}[y_{rcs}] = \begin{bmatrix} 1 & -R_z & R_y + y_r \cdot R_{yy} + YRY[y_{rcs}] \\ R_z & 1 & -R_x \\ -R_y - y_r \cdot R_{yy} - YRY[y_{rcs}] & R_x & 1 \end{bmatrix},$$

is a matrix valued function specifying an infinitesimal rotation depending on parameters: $R_x$, $R_y$, $R_z$, roll $R_{yy}$ and reticle y-tilt map function $YRY[y_{rcs}]$.

Let $x_r=(0,y_r,0)$ be the position of the slit shaped object area on the reticle in RCS, it lying along the y-axis. The following formulation of the alignment problem at $x_r$ is obtained by writing down the 3D transformation equation between the OPCS and the RCS, as an alignment problem in the RSCS:

$$\underline{M}_t \cdot \underline{t} + \underline{e}_{rs} + \underline{T}^{-1} \cdot \underline{T}_e^{-1} \cdot (\underline{R}_o \cdot \underline{x}_o + \underline{C}_o) = \underline{M} \cdot \underline{R}[\underline{x}_r + \underline{x}] \cdot (\underline{x}_r + \underline{x}) + \underline{C}_r + \overline{YTZ}[\underline{x}_r + \underline{x}] \cdot \underline{e}_z, \quad (1)$$

and setting $x=x_o$. Restrict x to the xy-plane. The right hand side of the equation is the reticle surface in the RSCS. The left hand side defines the best object plane in the RSCS as a first order polynomial in $x_o$. The problem is to find the out-of-plane tilts $T_y$, $T_x$ and the out-of-plane position $t_z$ by fitting the slit shaped area in the BOP to the slit shaped area on reticle surface located at $x_r$ in the RCS.

In the following this fit will be performed by the method of LSQ:

Set $x=x_o$ in Equation (1). Let $(x_i,y_1)$ be the grid for the coordinates x covering the slit shaped object area in the BOP, see item 51 in FIG. 5.

For a suitable grid, define a grid, consisting of equidistant gridlines of fixed x-value, where every grid line starts at the bottom of the slit shaped area and runs upward with fixed y-pitch until it reaches the top of the area.

The fitting problem can be formulated on this grid by the following set of linear equations for the vertical (out of plane) position $z_{fit}$ and tilts $R_{y,fit}$ and $R_{x,fit}$ of the BOP in the local RSCS:

$$z_{fit} - R_{y,fit} \cdot x_i + R_{x,fit} \cdot y_i = z_i, \text{ where i indexes all grid points.} \quad (2)$$

This linear set of equations can be solved as an LSQ fitting problem. Solving the equations by using a singular value decomposition would be a suitable method. The right hand side of Equation (2) is obtained by evaluating the z-component of the right hand side of Equation (1) at the grid points $(x_i, y_i)$:

$$z_i = C_r^z - R_y \cdot x_i + R_x \cdot (y_i + y_r) -$$
$$R_{yy} \cdot x_i \cdot (y_i + y_r) + YTZ[y_i + y_r] - YRY[y_i + y_r] \cdot x_i.$$

Here the z-component on the diagonal of $\overline{\overline{M}}$ has been set to one. Comparing the out-of-plane position $\overline{z}_{fit}$ and tilts $R_{y,fit}$ and $R_{x,fit}$ with those in the z-component of the left hand side of Eq. (1) leads to $$z_{fit} = t_z + e_{rs}^z + (T_y + T_e^y) \cdot C_o^x - (T_x + T_e^x) \cdot C_o^y + C_o^z,$$

$$R_{y,fit} = -T_y - T_e^y + R_o^y,$$

$$R_{x,fit} = -T_x - T_e^x + R_o^x. \quad (3)$$

Here the z-component on the diagonal of $\overline{\overline{M}}_t$ has been set to one. The vertical setpoint values $t_z$, $T_y$ and $T_x$ can be determined from Equation (3).

Preferably, a polynomial profile is generated by using the established data for the variables $z_{fit}$, $R_{y,fit}$ and $R_{x,fit}$. More preferably, the polynomial profile comprises a sequence of concatenated $4^{th}$ order polynomials, smoothly connected to each other. Such a function can be referred to as quartic ($4^{th}$ order) spline. Mathematic functions, like splines are known per se in the art and their properties will not be explained here in detail. The controlling of the displacement of the reticle stage during exposure of the substrate is preferably carried out in accordance with the thus obtained quartic spline.

Figure 6:
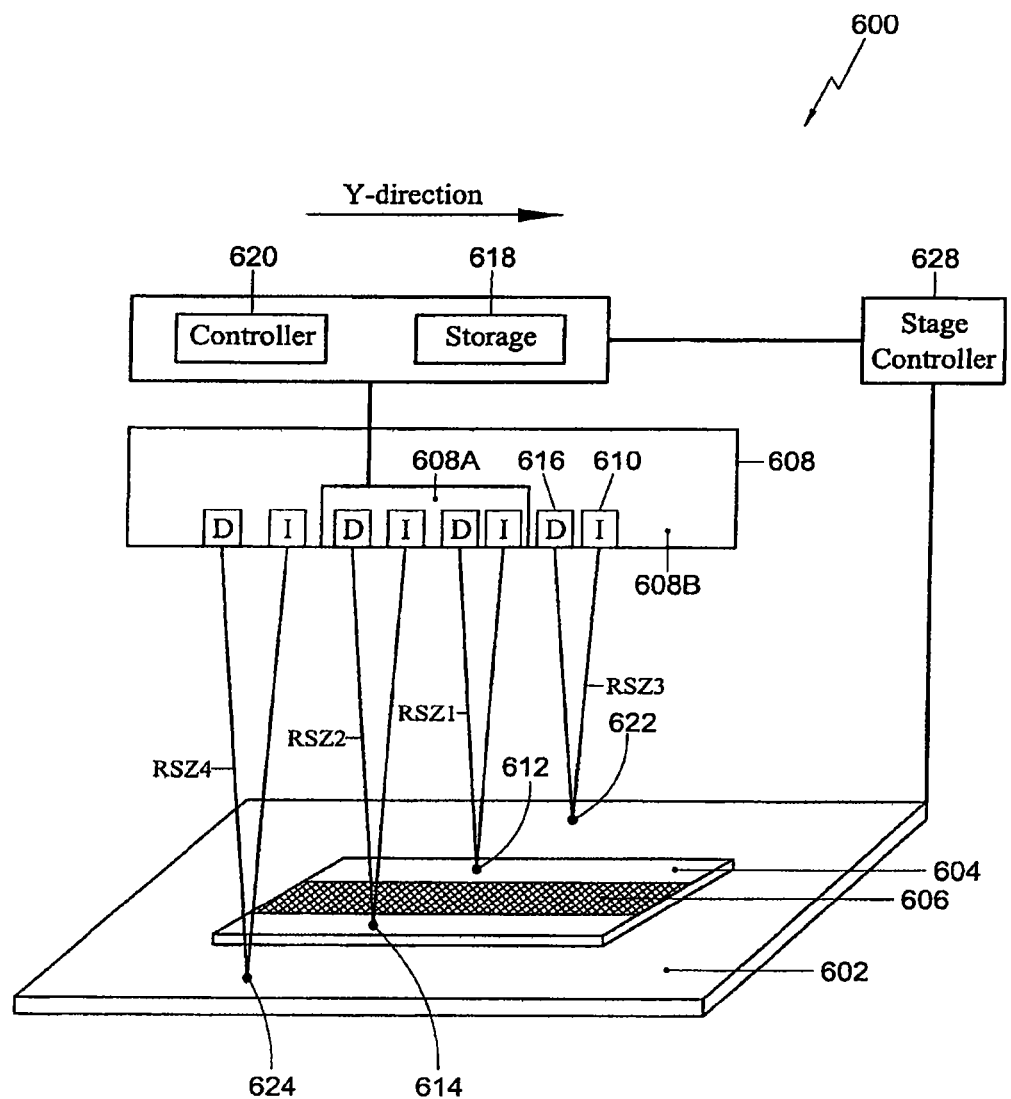
FIG. 6 depicts in a schematic way an embodiment of a lithographic apparatus according to the invention.

FIG. 6 depicts in a schematic way an embodiment of a lithographic apparatus according to the invention. FIG. 6 shows a portion 600 of a lithography tool according to embodiments of the present invention. Portion 200 includes a reticle stage 602 with a backside clamped reticle 604 that has a pattern 606. Although not drawn to scale, an interferometer system 608 includes two interferometers 608A and 608B. It is noted that it is also possible to use a single interferometer arranged to be used in a dual mode. Each interferometer 608A and 608B projects illuminating (I) light from illumination devices 610 towards portion 600. In various embodiments, illumination devices 210 can be light sources, lasers, or the like with or without focusing or expanding optical devices. A first set of interferometric measuring beams RSZ1 and RSZ2 from first interferometer 608A are reflected from first 612 and second 614 positions, respectively, on reticle 604. First position 612 is adjacent a first side of pattern 606 and second position 614 is adjacent a second side of pattern 606. The reflected beams are received by detectors (D) 616. Signals corresponding to the detected beams are stored in a storage device 618 either before or after being processed by controller 620.

A second set of interferometric measuring beams RSZ3 and RSZ4 from second interferometer 608B are reflected from first 622 and second 624 points, respectively, on reticle stage 602 and detected by detectors 616. Signals correlating to the detected beams are then stored in storage 618. In the embodiments shown and described above, all four measuring points, 612, 614, 622, and 624 substantially lie along a line having a same Y value. In other embodiments this may be required.

In other embodiments, signals represent an interferometric measurement based on either intensity, phase, distance, or the like of two related beams (i.e., RSZ1 and RSZ2 or RSZ3 and RSZ4) being compared. A resulting signal from the comparison corresponds to parameters (e.g., position, orientation, tilt, etc.) of either reticle stage 602 or reticle 604. In various embodiments, the four interferometer beams RSZ1-RSZ4 are used to determine two DOF (Z and Ry) of the patterned surface 606 of reticle 604. In these embodiments, Z is a direction about normal to the patterned surface 606 and parallel to the lithographic tool's optical axis. Also, in these embodiments, Ry is a rotation about a scan axis of the reticle stage 602. As described above, two interferometer beams (RSZ1 and RSZ2) reflect off of pattern surface 606 of reticle 604 on either side of the pattern 606.

Also, in various embodiments, the other two interferometer beams (RSZ3 and RSZ4) are positioned to reflect off of surfaces on the reticle stage 602. There are numerous options for the configuration of these reflective surfaces. In some embodiments, a first reflective surface (e.g., with point 622) of reticle stage 602 can be oriented in or parallel to the X-Y plane to give Z position feedback. Then, a second reflective surface (e.g., with point 624) of the reticle stage 602 can be oriented in or parallel to the X-Y plane. Alternate configurations are possible where the second reflective surface of reticle stage 602 can be oriented in or parallel to a Y-Z plane. Then, the second surface yields Ry stage position information. In further alternative embodiments, various other orientations exist where calculations would yield Z and Ry values. The lithographic tool would typically look at the difference between two interferometers (e.g., dual interferometer 610 or interferometers 610A and 610B) with separation in either the X or Z directions, thus giving Ry information.

Figure 7:
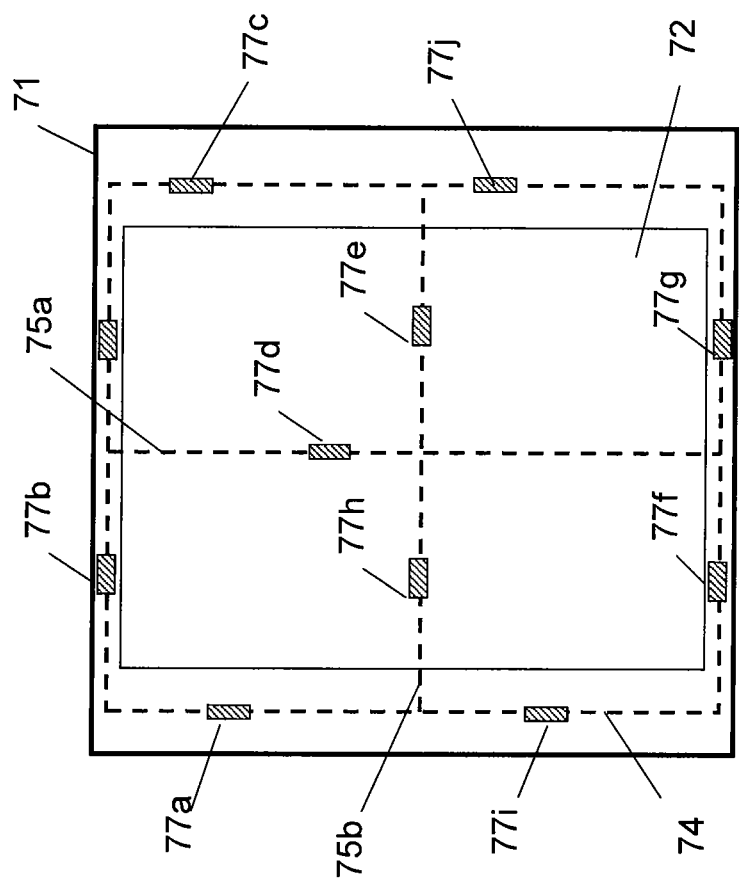
FIG. 7 depicts in a schematic way an embodiment of a reticle mapping using surface measurement points assigned to the notional lines.

FIG. 7 depicts in a schematic way an embodiment of a reticle mapping using surface measurement points assigned to the notional lines. A common reticle 71 as known in the art, comprises a usable field 72 which is used for patterning a suitable radiation beam impinging on the reticle 71. The usable field 72 may be surrounded by suitable image sensor marks 74 for enabling the measurement as described with reference to FIG. 4. The reticle 71 may further comprise the scribe lanes 75a, 75b which may be used to separate multiple identical products. It is found that the scribe lanes may be successfully used during reticle surface mapping thereby improving the surface dataset. For example, it is found that by acquiring information about the reticle height and tilt profile using at least one or two scribe lanes reticle levelling can be performed with a higher degree of accuracy without adding extra degrees of freedom in the levelling profile expressed in the non-linear function discussed above. The scribe lanes 75a, 75b may be used to define notional lines on the reticle 71. The scribe lanes may be preferably arranged with reflective image sensor (RIS) marks or with transmission image sensor (TIS) marks which may be used as surface measurement points for enabling surface measurement data representative of the tilt and height profile of the reticle. For example, for a conventional lithographic apparatus either RIS or TIS, or their suitable combination marks may be used. For an EUV lithographic apparatus it is preferable to use RIS marks. Use of TIS marks may have an advantage that for small illumination angle the projection system may be kept telecentric on the mask (object) side. It will be appreciated that although a plurality of image sensor marks 77*a*-77*j* is schematically depicted on the reticle 71 in practice both a number of the marks and their placement on the reticle surface may be optimized. For example, in cases when it is a-priori envisaged that the reticle stage is conceived to be deformed substantially in a particular area, this area, transversed by the scribe lanes 75*a*, 75*b*, may be provided with an increased number of the image sensor marks resulting in a non-uniform distribution of image sensor marks over the surface of the reticle 71. In this way correction of the tilt and height profile of the reticle according to the invention is still further improved.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising exposing a substrate with a patterned beam of radiation formed by a reticle having a patterned reticle surface and mounted on a displaceable reticle stage, wherein the method comprises:
measuring at least a portion of a reticle surface and at least a portion of a reticle stage surface using interferometry;
determining a non-linear function based only on the measuring of at least a portion of the reticle surface and at least a portion of the reticle stage for approximating a height and a tilt profile of the reticle surface with respect to the reticle stage; and
controlling a displacement of the reticle stage during exposure of the substrate in accordance with the non-linear function.

2. The method according to claim 1, wherein determining the non-linear function comprises:
determining a first dataset corresponding to a height and a tilt data of the reticle on a first grid; and
determining a second dataset corresponding to a number of reticle stage setpoints on a second grid.

3. The method according to claim 2, wherein determining the non-linear function further comprises fitting a sequence of the setpoints using the non-linear function.

4. The method according to claim 3, wherein a least squares fit is used for the determining the second dataset thereby fitting the first grid and the second grid.

5. The method according to claim 2, wherein the first dataset is determined using reticle measurement points.

6. The method according to claim 5, wherein the reticle measurement points are positioned on notional lines associated with scribe lanes of the reticle.

7. The method according to claim 6, wherein the scribe lanes comprise image sensor marks.

8. A computer readable medium having computer executable code encoded thereon, comprising instructions configured to cause a processor to execute the method of claim 1.

9. The method according to claim 1, wherein the beam of radiation is a beam of extreme ultraviolet radiation.

10. The method according to claim 9, wherein the reticle is a reflective reticle.

11. A lithographic apparatus arranged to project a pattern from a patterning device onto a substrate, said apparatus comprising:
a displaceable reticle stage configured to support a reticle, said reticle having a patterned reticle surface;
one or more interferometric detectors configured to determine data from surface measurement of at least a portion of a reticle surface and at least a portion of a reticle stage surface;
a processor configured to approximate a height and a tilt profile of the reticle surface with respect to the reticle stage by a non-linear function using only the data from the surface measurement of at least a portion of the reticle surface and at least a portion of the reticle stage surface; and
a controller configured to control a displacement of the reticle stage during exposure of the substrate in accordance with the non-linear function.

12. The apparatus according to claim 11, wherein the detector comprises an interferometer.

13. A lithographic apparatus comprising:
an illumination system configured to condition a radiation beam;
a reticle stage configured to support a reticle having a patterned reticle surface, the reticle being capable of imparting the radiation beam with a pattern in its cross-section to form a patterned radiation beam, whereby the reticle stage is displaceably arranged;

a substrate table configured to hold a substrate;

a projection system configured to project the patterned radiation beam onto a target portion of the substrate;

one or more interferometric detectors configured to determine data from surface measurement of at least a portion of a reticle surface and at least a portion of a reticle stage surface;

a processor configured to approximate a height and a tilt profile of the reticle surface by a non-linear function using only the data from the surface measurement of at least a portion of the reticle surface and at least a portion of the reticle stage surface; and a controller for controlling a displacement of the reticle stage during exposure of the substrate in accordance with the non-linear function.

14. The lithographic apparatus according to claim 13, wherein the detector comprises an interferometer.

15. The lithographic apparatus according to claim 13, wherein the reticle is a reflective reticle.

* * * * *